United States Patent
Papa et al.

(10) Patent No.: US 11,705,201 B2
(45) Date of Patent: *Jul. 18, 2023

(54) LOG DATA STORAGE FOR FLASH MEMORY

(71) Applicant: Micron Technology, Inc., Boise, ID (US)

(72) Inventors: Paolo Papa, Naples (IT); Luigi Esposito, Piano di Sorrento (IT); Massimo Iaculo, San Marco Evangelista (IT); Eric Kwok Fung Yuen, Dublin, CA (US); Gerard J. Perdaems, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/409,413

(22) Filed: Aug. 23, 2021

(65) Prior Publication Data

US 2021/0383872 A1 Dec. 9, 2021

Related U.S. Application Data

(63) Continuation of application No. 15/690,889, filed on Aug. 30, 2017, now Pat. No. 11,100,996.

(51) Int. Cl.
*G06F 12/00* (2006.01)
*G11C 16/10* (2006.01)
(Continued)

(52) U.S. Cl.
CPC ............ *G11C 16/10* (2013.01); *G06F 3/0604* (2013.01); *G06F 3/064* (2013.01); *G06F 3/0619* (2013.01);
(Continued)

(58) Field of Classification Search
CPC ..... G06F 3/0604; G06F 3/0659; G06F 3/0679
See application file for complete search history.

(56) References Cited

U.S. PATENT DOCUMENTS 5,875,454 A 2/1999 Craft et al.
6,625,671 B1 9/2003 Collette et al.
(Continued)

FOREIGN PATENT DOCUMENTS

CN 101231885 A 7/2008
CN 101361135 A 2/2009
(Continued)

OTHER PUBLICATIONS

"Chinese Application Serial No. 201880061721.X, Office Action dated Nov. 11, 2020", w/English translation, 28 pgs.
(Continued)

*Primary Examiner* — Gurtej Bansal
(74) *Attorney, Agent, or Firm* — Schwegman Lundberg & Woessner, P.A.

(57) ABSTRACT

Devices and techniques for managing flash memory are disclosed herein. A memory controller may receive a first program request comprising first host data to be written to the flash memory. The flash memory may comprise a number of storage units with each storage unit comprising a number of storage sub-units. If the first host data is less than a remainder threshold, the memory controller may generate a first program data unit comprising the first host data and first log data describing the flash memory. The memory controller may program the program data unit to the first storage unit of the flash memory, where the first log data is written to a first storage sub-unit of the number of storage sub-unit. The memory controller may also store an indication that the first storage sub-unit is invalid.

20 Claims, 12 Drawing Sheets

(51) Int. Cl.
*G06F 3/06* (2006.01)
*G06F 11/07* (2006.01)
*G11C 16/04* (2006.01)

(52) U.S. Cl.
CPC .......... *G06F 3/0643* (2013.01); *G06F 3/0659* (2013.01); *G06F 3/0679* (2013.01); *G06F 11/079* (2013.01); *G06F 11/0727* (2013.01); *G06F 11/0778* (2013.01); *G11C 16/0483* (2013.01)

(56) References Cited

U.S. PATENT DOCUMENTS

| | | | |
|---|---|---|---|
| 11,100,996 | B2 | 8/2021 | Papa et al. |
| 2003/0163663 | A1 | 8/2003 | Aasheim et al. |
| 2005/0071579 | A1 | 3/2005 | Luick |
| 2005/0144368 | A1* | 6/2005 | Chung .............. G06F 12/0246 711/E12.008 |
| 2007/0033325 | A1 | 2/2007 | Sinclair |
| 2008/0244331 | A1 | 10/2008 | Grimes et al. |
| 2009/0049234 | A1 | 2/2009 | Oh et al. |
| 2009/0287874 | A1 | 11/2009 | Rogers et al. |
| 2010/0106905 | A1 | 4/2010 | Kurashige |
| 2010/0115182 | A1 | 5/2010 | Murugesan |
| 2012/0102297 | A1 | 4/2012 | Haines |
| 2012/0198131 | A1 | 8/2012 | Tan et al. |
| 2013/0042054 | A1 | 2/2013 | Jung |
| 2013/0227198 | A1* | 8/2013 | Lee .................. G06F 12/0246 711/103 |
| 2015/0160893 | A1 | 6/2015 | Gorobets et al. |
| 2016/0266825 | A1 | 9/2016 | Waseda et al. |
| 2017/0115900 | A1 | 4/2017 | Camp et al. |
| 2019/0066791 | A1 | 2/2019 | Papa et al. |

FOREIGN PATENT DOCUMENTS

| | | |
|---|---|---|
| CN | 101652751 A | 2/2010 |
| CN | 109669889 A | 4/2019 |
| CN | 111133410 A | 5/2020 |
| TW | 200947440 A | 11/2009 |
| TW | 201923554 A | 6/2019 |
| WO | WO-2019046128 A1 | 3/2019 |

OTHER PUBLICATIONS

"Chinese Application Serial No. 201880061721.X, Voluntary Amendment Filed Aug. 25, 2020", w/ English Claim, 23 pgs.

"International Application Serial No. PCT/US2018/047988, international Preliminary Report on Patentability dated Mar. 12, 2020", 7 pgs.

"International Application Serial No. PCT/US2018/047988, International Search Report dated Dec. 5, 2018", 5 pgs.

"International Application Serial No. PCT/US2018/047988, Written Opinion dated Dec. 5, 2018", 5 pgs.

"NAND Flash 101: An Introduction to NAND Flash and How to Design it in to Your Next Product", Micron TN-29-19: NAND Flash 101, (2006), 27 pgs.

"Taiwanese Application Serial No. 107130225, Office Action dated Oct. 23, 2019", w/ English Translation, 18 pgs.

"Taiwanese Application Serial No. 107130225, Response filed Jan. 22, 2020 to Office Action dated Oct. 23, 2019", w/ English Claims, 55 pgs.

"TN-29-59: Bad Block Management in NAND Flash Memory", Micron, (2011), 4 pgs.

"TN-2960: Garbage Collection in SLC NAND Flash Memory", Micron, (2011), 4 pgs.

Goossaert, Emmanuel, "Coding for SSDs—Part 3: Pages, Blocks, and the Flash Translation Layer", Software and thoughts by Emmanuel Goossaert, (2014), 18 pgs.

Lee, Sang-Won, et al., "Accelerating In-Page Logging with Non-Volatile Memory", Bulletin of the IEEE Computer Society Technical Committee on Data Engineering, (2010), 7 pgs.

Na, Gap-Joo, et al., "In-Page Logging B-free for Flash Memory", X. Zhou et al. (Eds.): DASFAA 2009, LNCS 5463 Springer-Verlag Berlin Heidelberg, (2009), 755-758.

"Chinese Application Serial No. 201880061721.X, Office Action dated Mar. 18, 2021", w English Translation, 6 pgs.

"Chinese Application Serial No. 201880061721.X, Response filed Mar. 2, 2021 to Office Action dated Nov. 11, 2020", w English Claims, 20 pgs.

"Chinese Application Serial No. 201880061721.X, Office Action dated Mar. 18, 2021", w English spec, 105 pgs.

* cited by examiner

LOG DATA STORAGE FOR FLASH MEMORY

PRIORITY APPLICATION

This application is a continuation of U.S. application Ser. No. 15/690,889, filed Aug. 30, 2017, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multilevel cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

Flash memory devices sometimes fail for various reasons including, for example, unexpected power failures, hardware failures, software bugs, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
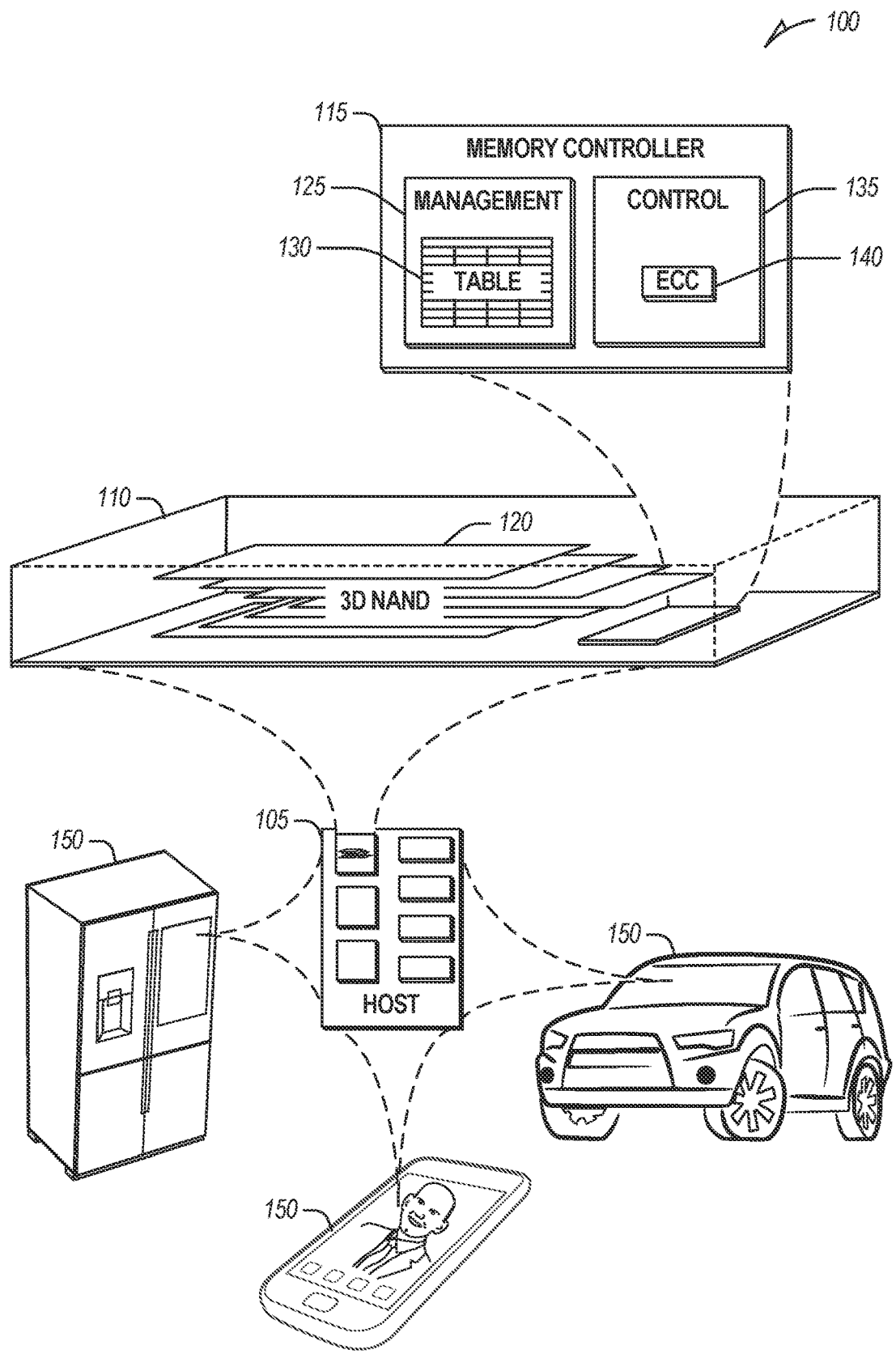
FIG. 1 illustrates an example of an environment including a memory device.

Some flash memory devices store log data describing the state of the flash memory. If the flash memory fails, log data may be retrieved and used with the goal of diagnosing and potentially correcting the error that lead to the failure. Stored log data, however, occupies storage units at the flash memory. This may increase the overprovisioning of the flash memory, which adds expense and size to the flash memory without increasing the host data capacity. Storing log data may also use additional program operations to write the log data to the flash memory, which decreases performance by increasing latency. Also, storing log data, in some examples, adds to the complexity of the memory controller. For example, log data may be managed and garbage-collected separate from host data. Also, in some examples, logging points impact test results. As a result of these difficulties, many flash memories store minimal, high-level log data which may be of limited use for debugging.

Various examples described herein are directed to systems and methods for storing log data and host data at a flash memory storage unit. In some examples, a memory controller programs a storage unit at a flash memory with host data that of a small enough size that the host data can be stored using less than all of the storage sub-units of the storage unit. Storage sub-units that are "left over" after the host data is stored may be referred to as remainder storage sub-units. Depending on various factors, such as the size of the host data, the architecture of the flash memory, etc., a memory controller may not write additional host data to remainder sub-units and may mark remainder sub-units as logically invalid. At a subsequent garbage collection cycle, the logically invalid remainder sub-units are discarded.

Sometimes, the memory controller writes dummy data to remainder sub-units or leaves them blank. In various examples described herein, however, the memory controller writes log data to remainder sub-units. The log data persists at and may be retrievable from) the remainder sub-units, for example, until a subsequent garbage collection cycle for the storage unit. During the garbage collection cycle for the sub-unit, the log data is discarded. In this way, the memory controller may store log data at a flash memory, for example, with minimal additional overprovisioning. Also, overhead associated with garbage collecting log data may be performed by a garbage collection cycle already implemented for the flash memory.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device HO. In some examples, the host device 105 may be a machine having some portion, or all, of the components discussed in reference to the machine 1200 of FIG. 12.

The memory controller 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host device 105 and the memory device 110, The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an KC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of storage units including devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the Memory device 110 in pages, and erased in blocks. However, one or more memory operations (e.g., read, write, erase, etc.) can be performed on larger or smaller groups of memory cells, as desired. The data transfer size of a Memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32

B, 54 B, 224 B, etc.) of metadata corresponding to the user data, such as integrity data (e.g., error detecting or correcting code data), address data (e.g., logical address data, etc.), or other metadata associated with the user data. Storage unit or sub-units for storing metadata, etc. may be referred to as over-provisioned storage units or sub-units.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multilevel cell (MLC) NAND flash device may have a higher bit error rate than a corresponding single-level cell (SLC) NAND flash device. As such, the MLC device may require more metadata bytes for error data than the corresponding SLC device.

Figure 2:
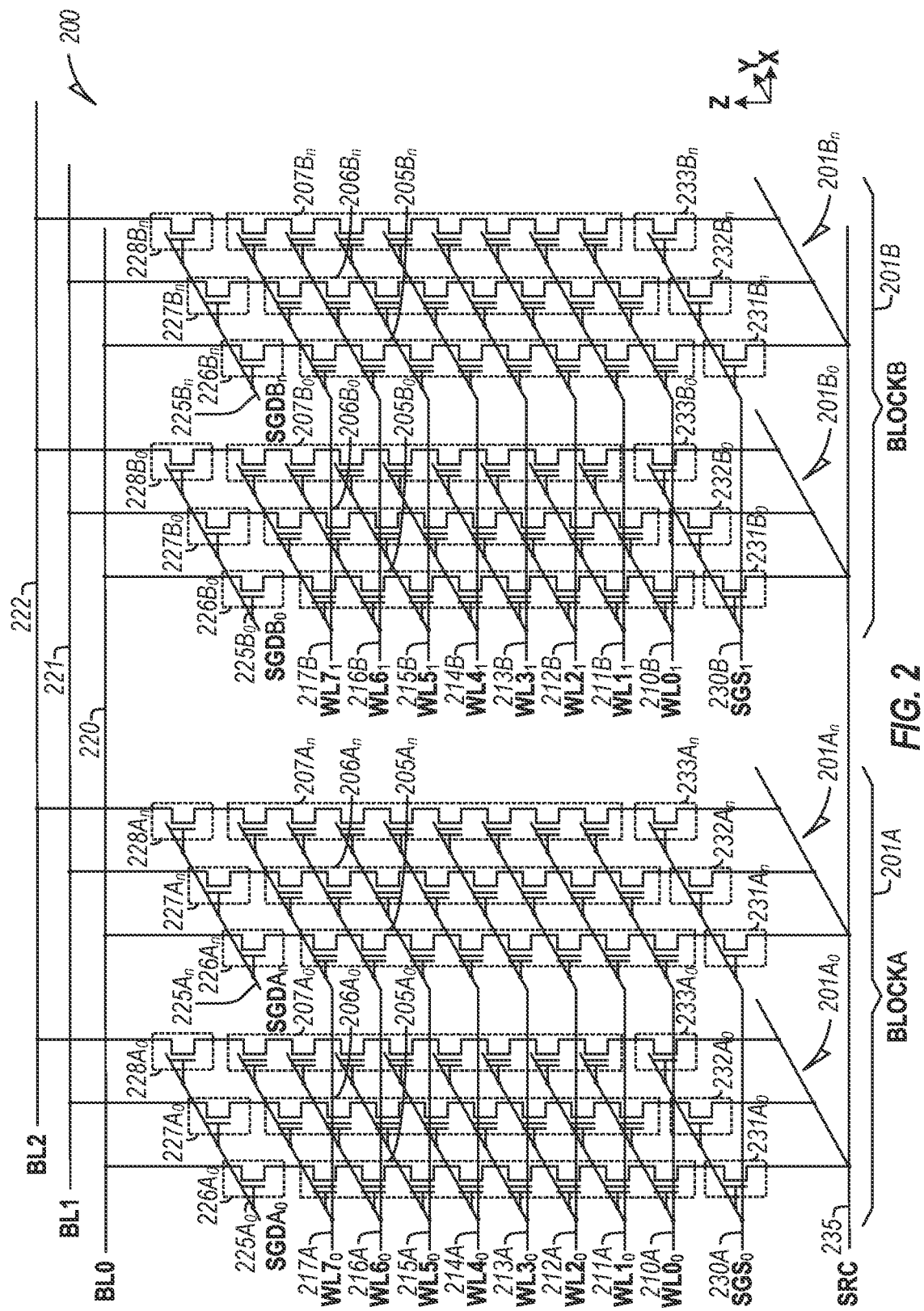
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231$A_0$-233$A_0$, first-third $A_n$ SGS 231$A_n$-233$A_n$, first-third $B_0$ SGS 231$B_0$-233$B_0$, first-third $B_n$ SGS 231$B_n$-233$B_n$, etc.) and a drain-side select gate (SGD) (e.g., first-third $A_0$ SGD 226$A_0$-228$A_0$, first-third $A_n$ SGD 226$A_n$-228$A_n$, first-third $B_0$ SGD 226$B_0$-228$B_0$, first-third $B_n$ SGD 226$B_n$-228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 226$A_0$-228$A_0$ can be accessed using an $A_0$ SGD line $SGDA_0$ 225$A_0$, first-third $A_n$ SGD 226$A_n$-228$A_n$ can be accessed using an $A_n$ SGD line $SGDA_n$ 225$A_n$, first-third $B_0$ SGD 226$B_0$-228$B_0$ can be accessed using an $B_0$ SGD line $SGDB_0$ 225$B_0$, and first-third $B_n$ SGD 226$B_n$-228$B_n$ can be accessed using an $B_n$ SGD line $SGDB_n$ 225$B_n$. First-third $A_0$ SGS 231$A_0$-233$A_0$ and first-third $A_n$ SGS 231$A_n$-233$A_n$ can be accessed using a gate select line $SGS_0$ 230A, and first-third $B_0$ SGS 231$B_0$-233$B_0$ and first-third $B_n$ SGS 231$B_n$-233$B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
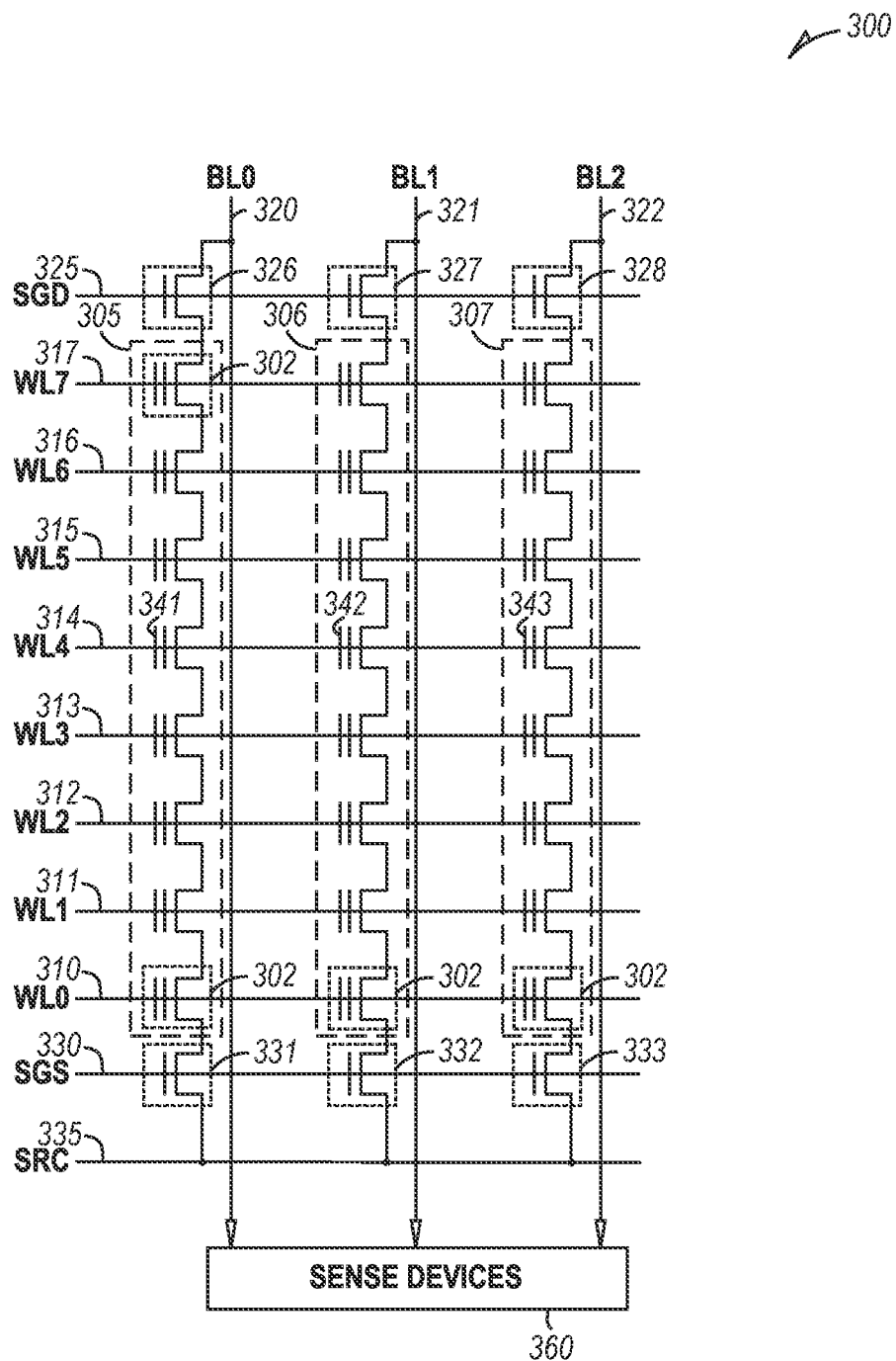

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
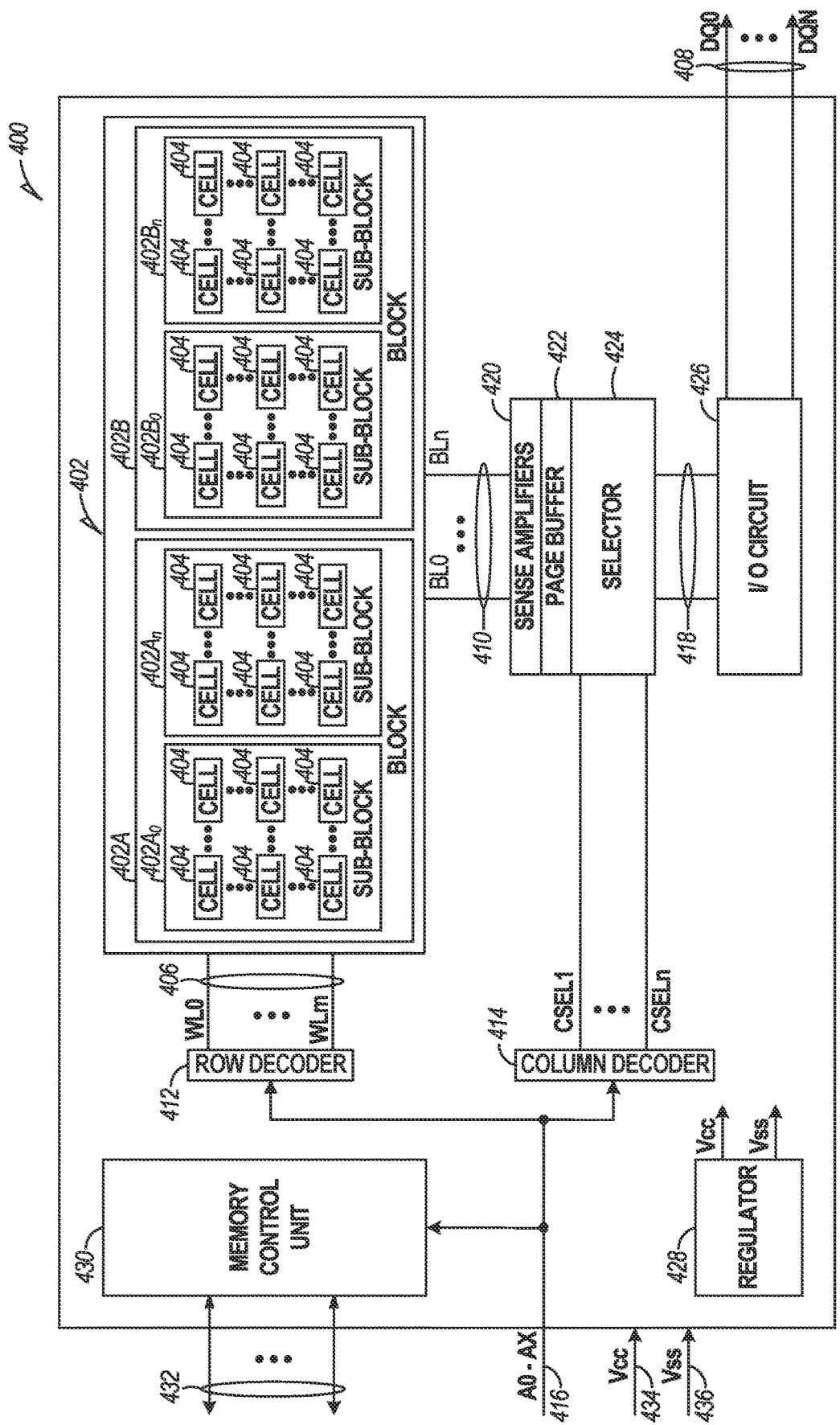
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416, The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
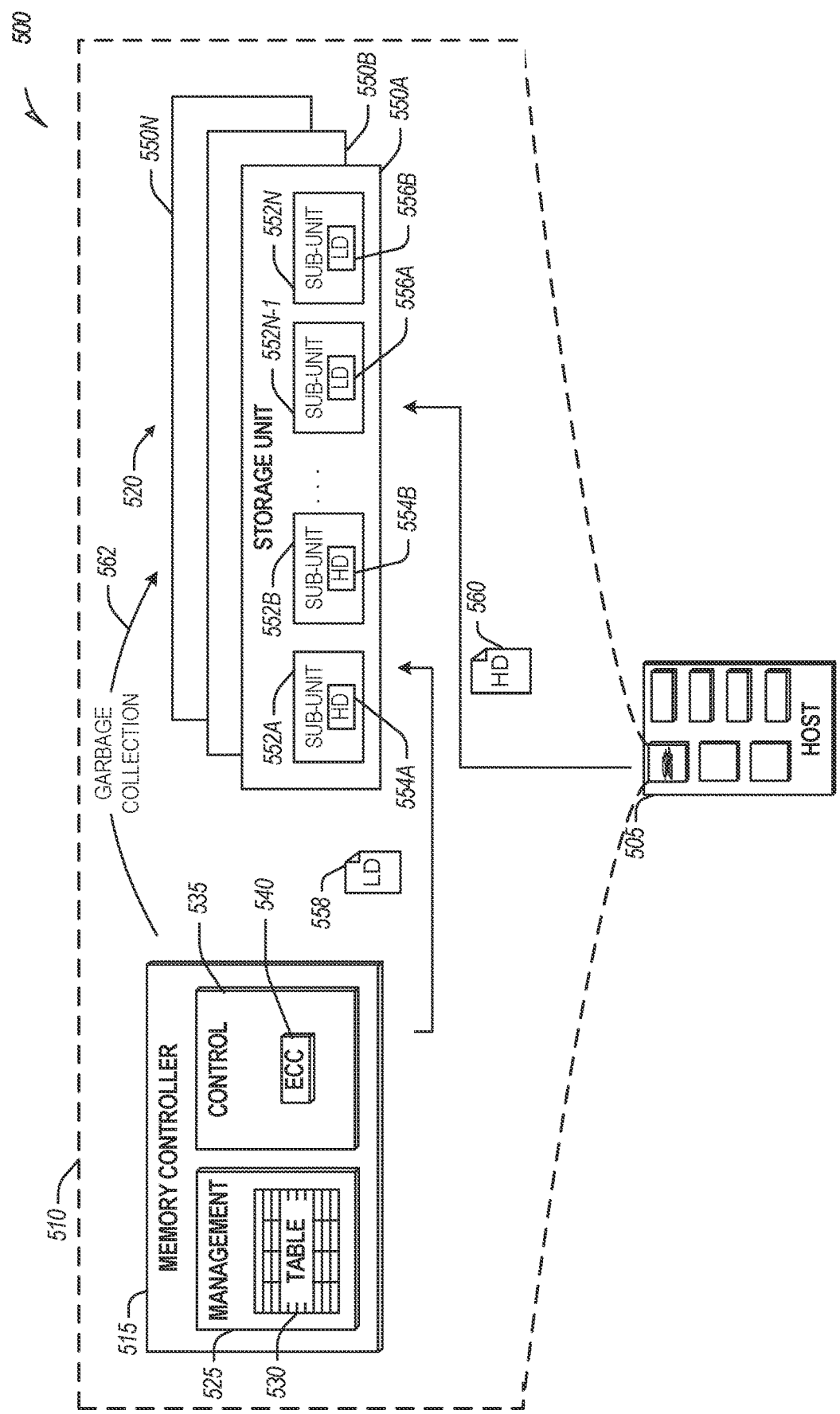
FIG. 5 illustrates an example of an environment for log data storage for flash memory.

FIG. 5 illustrates an example of an environment 500 for log data storage for flash memory. The environment 500 includes a host device 505 that may be similar to the host device 105 of FIG. 1. The host device 505 includes a Memory device 510 that may be similar to the Memory device 110 of FIG. 1. For example, the memory device 510 includes a memory array 520 and a memory controller 515. The memory controller 515 includes a memory manager 525 including one or more management tables 530. The memory controller also includes an array controller 535 that may manage the memory array 520, for example, as described herein. Optionally, the array controller 535 includes an ECC component 540.

The memory array 520 includes example storage units 550A, 550B, 550N. Although three storage units 550A, 550B, 550N are shown, any suitable number of storage units may be used. The example storage unit 550A includes storage sub-units 552A, 552B, 552N-1, 552N. Although four storage sub-units 552A, 552B, 552N-1, 552N are shown, the various storage units 550A, 550B, 500N may have any suitable number of storage sub-units. Example physical implementations of storage units and storage sub-units are described herein with reference to FIGS. 6-8.

The host device 505 may provide host data 560 to the Memory device 510. The host data 560 may be any suitable data generated by the host device 505. The memory controller 515 may receive the host data 560 and determine if the host data 560 is smaller than a remainder threshold. The remainder threshold may indicate minimum size of the host data 560 that would at least partially fill all of the storage sub-units 552A, 552B, 554N-1, 552N of a storage unit 550A, 550B, 550N. For example, if the host data 560 is smaller than the remainder threshold, then at least one of the storage sub-units 552A, 552B, 554N-1, 552N is a remainder storage sub-unit that will not include any of the host data. The memory controller 515 may supplement the host data 560 with log data 558 to form a program data unit that includes both the host data 560 and the log data 558. The memory controller may program the program data unit to the storage unit 550A.

In the example of FIG. 5, the host data 560 is below the remainder threshold, rendering at least storage sub-units 552N-1 and 557N as remainder sub-units. For example, storage sub-units 552A, 552B store host data portions 554A, and 554B, respectively. Storage sub-units 552N-1 and 552N are remainder storage sub-units that store log data portions 556A, 556B, respectively. Although two remainder storage sub-units 552N-1 and 552N are shown in FIG. 5, any suitable number of remainder storage sub-units may be present in different examples and implementations. As described herein, the memory controller 515 may mark storage sub-units 552N-1, 552N as logically invalid.

Log data 558 may include any suitable data describing the Memory device 510. Example log data may include, for example, all or part of one or more of the management tables 530. For example, log data may comprise all or part of a logical block map describing the memory device 510. The logical block map may describe relationships between logical addresses for host data and the physical addresses of the host data at the memory array 520. For example, the logical block map may be all or part of a management table 530. Other log data may include, for example, garbage collection status data describing the stat of garbage collection operations at the memory device, a location of one or more checkpoints in the memory array, information regarding an event that prompted a log flush, records of program operations at the memory array 520, variable states describing the memory array 520, etc.

The memory controller 515 is also programmed to perform a garbage collection cycle 562 at the memory array 520. The garbage collection cycle 562 may include consolidating current host data stored at storage units 550A, 550B, 550N. For example, as described herein, host data is typically programmed to the Memory device 510 in pages and erased in blocks, which include multiple pages. Accordingly, when host data stored at a first page is modified, the memory controller 515 may write the modified host data to a second page and mark the first page logically invalid, for example, by writing an indication that the page is logically invalid to the logical block map or other management table 530.

During the garbage collection cycle 562, the memory controller 515 may move host data stored at a block to pages of a new block and erase the block. Data stored at logically invalid pages or sectors is discarded when the block is erased. The garbage collection cycle 562, in some examples, is executed periodically. For example, the garbage collection cycle 562 may be performed at a given time period (e.g., once a week, once a day, once an hour, etc.). In other examples, the garbage collection cycle 562 is executed when a threshold number of transactions have been made to the memory device 510. In other examples, the garbage collection cycle 562 is executed when a threshold level of fragmentation is present at the memory array 520. The garbage collection cycle 562 may be performed with respect to the entire memory array 520 and/or with respect to less than all of the memory array 520 (e.g., a plane, a block, etc.)

Log data stored at remainder storage sub-units, such as 552N-1, 552N, may be returned to the host device 505 or other suitable diagnostic device, for example, in response to a request for log data. When the garbage collection cycle 562 is performed, log data stored at logically invalid remainder storage sub-units 552N-1, 552N in the portion of the memory array 520 subject to the garbage collection cycle 562 is discarded. In this way, log data written to remainder storage sub-units 552N-1, 552N may be managed by the garbage collection cycle 562 without adding (significant) overhead to the memory device 510. Garbage collection cycles 562 may be configured to execute at an interval that retains log data while it is likely to be useful in debugging a failure.

Figure 6:
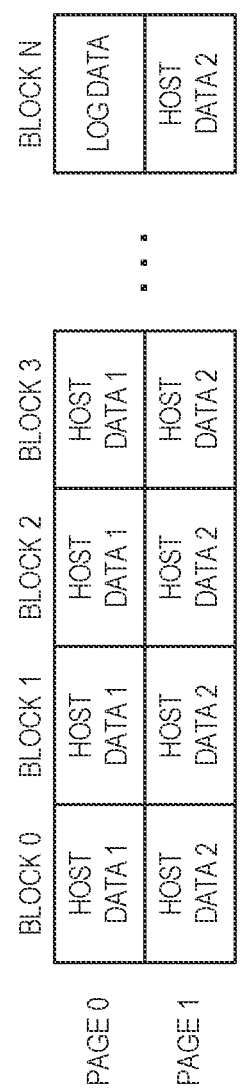
FIG. 6 is a block diagram illustrating an example arrangement of a memory array portion.

FIG. 6 is a block diagram illustrating one example arrangement of a memory array portion 600. For example, the memory array portion 600 may be all or part of the memory array 120 of FIG. 1 or the memory array 520 of FIG. 5. The memory array portion 600 includes a set of parallel-programmable blocks, labeled Block 0, Block 1, Block 2, Block 3, Block N. Although five blocks are shown, the memory array portion 600 may include any suitable number of blocks. Blocks 0-N include various pages, such as Pages 0-1 shown. For example, Block 0 may include a Page 0 and a Page 1, Block 1 may include a Page 0 and a Page 1, and so on. Although only two pages are shown in FIG. 6, various example memory arrays may include a different number of pages.

Because the Blocks 0-N are parallel-programmable, a memory controller, such as memory controller 115 or 515, can simultaneously program a page from each Block 0-N in the same busy cycle. For example, the Page 0 from Block 0, the Page 0 from Block 1, the Page 0 from Block 2, the Page 0 from Block 3, the Page 0 from Block N, etc., may be programmed in the same busy cycle. The set of pages that can be programmed during the same busy cycle may be referred to as a set of parallel-programmable pages.

In the example of FIG. 6, a storage unit may be a set of parallel-programmable pages and storage sub-units may be individual pages from a set of parallel-programmable pages. A remainder threshold for a set of parallel-programmable pages may be an amount of data that would at least partially fill all of the pages of a set of parallel-programmable pages. For example, host data below the remainder threshold may not fill at least one page of the set of parallel programmable pages. In the example of FIG. 6, Host Data 2 is greater than or equal to the remainder threshold. As shown, portions of Host Data 2 are stored at all of the set of parallel-programmable pages including the from Blocks 0-N. Host Data 1, however, is less than the remainder threshold. As indicated, at least Page 0 of Block N is a remainder page including Log Data.

Figure 7:
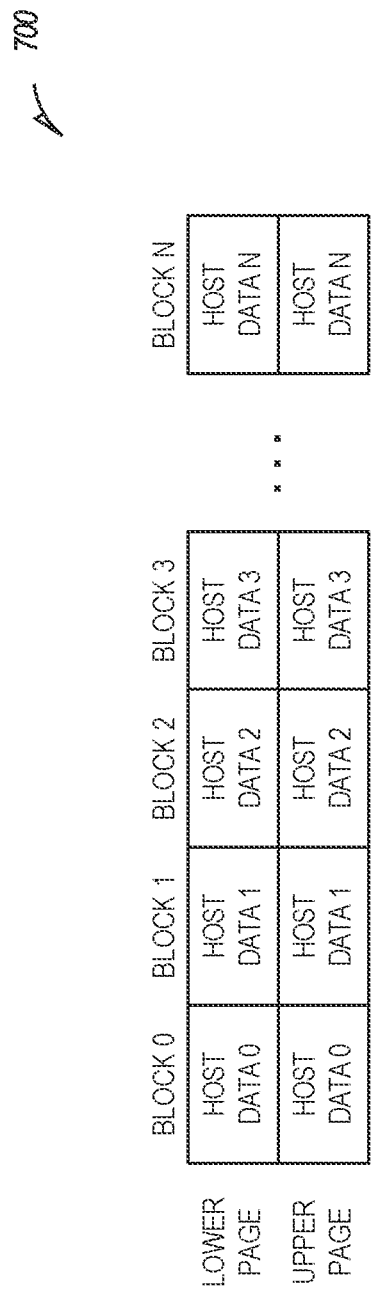
FIG. 7 is a block diagram illustrating another example of a memory array portion.

FIG. 7 is a block diagram illustrating another example of a memory array portion 700. For example, the memory array portion 700 may be all or part of the memory array 120 of FIG. 1 or the memory array 520 of FIG. 5. The memory array portion 700 includes a set of Blocks labeled 0-N. Two pages are shows across the Blocks 0-N including Upper Pages and Lower Pages. Upper Pages and Lower Pages may be included in examples of the memory arrays described herein that use flash memory cells that can represent one of more than two programmed states (e.g., MLC, TLC, etc.). For example, in FIG. 7, the Lower Page of Block 0 and the Upper Page of Block 0 may be implemented at the same physical page, where the Lower Page of Block 0 is represented by the least significant bits stored at the corresponding memory cells of the physical page and the Upper Page of Block 0 is represented by the most significant bits at the corresponding memory cells physical page. If TLC or higher is used, additional extra pages may utilize other bits at the memory cells of the physical page.

In some examples, the memory controller 115, 515 may implement single pass programming in which complimentary pages at a block are programmed at the same time. Complimentary pages may include an upper page, a lower page, and optionally one or more extra pages implemented at the same physical memory cells. If host data is programmed to a set of complimentary pages, at least one of the complimentary pages is not programmed, going back and programming the un-programmed remainder page may be complicated and, in some cases, not possible.

In the Example of FIG. 7, the storage unit may be a set of complimentary pages. Storage sub-units may be individual pages from the set of complimentary pages. The remainder threshold may be a size that would fill at least a portion of each page in a set of complimentary pages. In the MLC example of FIG. 7, then, the storage unit size may be the size of one page. For example, if Host Data is less than or equal to the size of one page, then it may be programmed to either an upper page or a lower page and the other page of the set of complimentary pages may be a remainder page. In the example of FIG. 7, the Lower Page and Upper Page at Block 0 are programmed with portions of Host Data 0, where Host Data 0 is larger than the size of one page, but smaller than the sum of the Upper and Lower pages. This is also the case with Host Data 1 at Block 1, Host Data 2 at Block 2 and Host Data N at Block N. At example Block N, however, Host Data N, as illustrated, is less than or equal to the size of the lower page. Accordingly, Host Data N is programmed to the Lower Page of Block 3 and the Upper Page of Block 3 is a remainder page programmed with Log Data.

Figure 8:
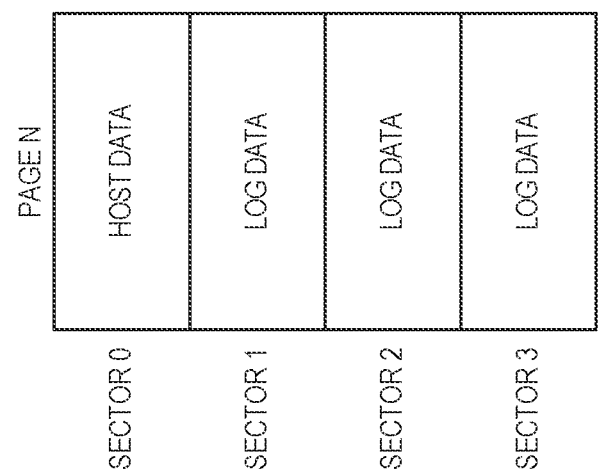
FIG. 8 is a block diagram illustration another example of a memory array portion.

FIG. 8 is a block diagram illustration another example of a memory array portion 800. The portion 800 includes a single page, Page N that includes four sectors, Sectors 0-3, In the example of FIG. 8, a storage unit may be a page and storage sub-units may be sectors at the page. The remainder threshold may be a size that would at least partially fill all sectors of the page. In the example of FIG. 8, Host Data is stored at Sector 0 while Sectors 1-3 are remainder sectors including Log Data.

In some examples, a memory device, such as 110, 510, may implement log data storage using different storage units and sub-units at the same time. For example, the Blocks 0-N of the memory array portion 700 may be parallel programmable. Accordingly, a remainder page may occur if host data to be programmed to a particular set of complimentary pages would leave one or more of the set of complimentary pages blank or if host data to be written to a set of parallel programmable pages would leave one or more of the parallel programmable pages blank. Also, in some examples, individual pages of FIGS. 6 and/or 7 may be storage units including sectors as storage sub-units in the manner shown in FIG. 8.

Figure 9:
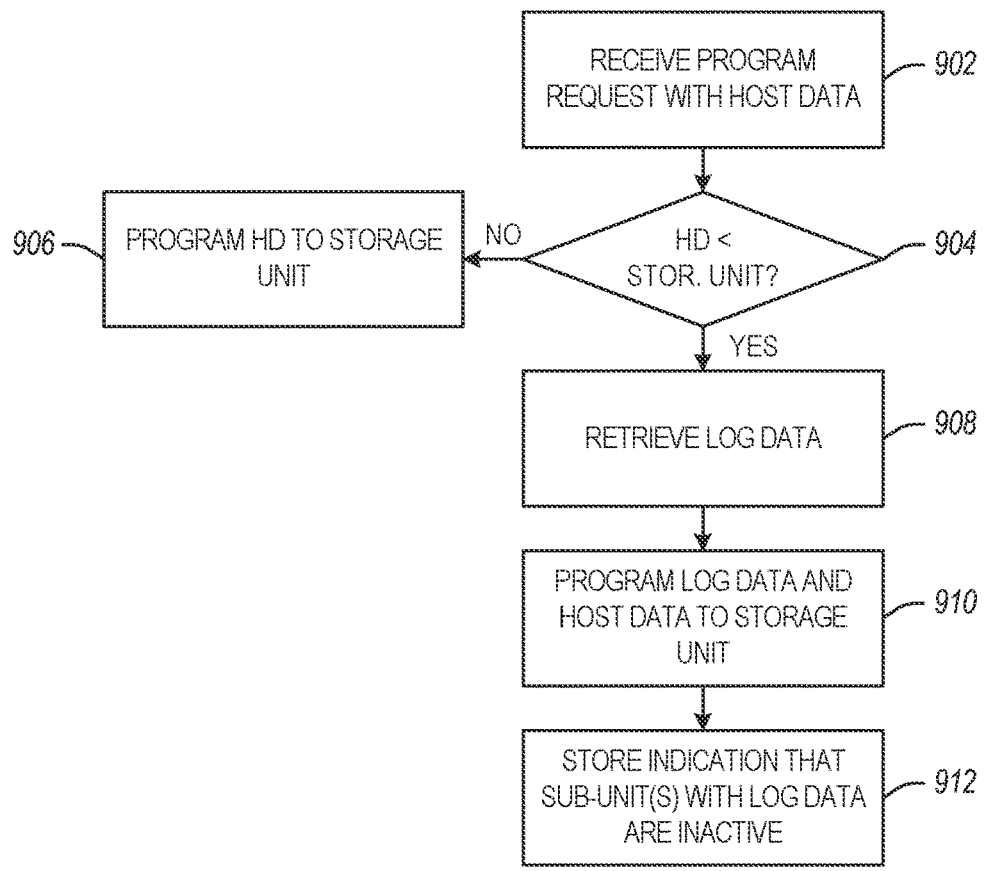
FIG. 9 is a flowchart showing one example of a process flow that may be executed, for example, by a memory controller to program log data to remainder storage sub-units.

FIG. 9 is a flowchart showing one example of a process flow 900 that may be executed, for example, by a memory controller (such as memory controller 115 or memory controller 515) to program log data to remainder storage sub-units. At operation 902, the memory controller may receive a program request from a host device (such as the host device 105 or the host device 505). The program request may include host data to be written to a memory device (such as the memory device 110 or the memory device 510). At operation 904, the memory controller may determine if a size of the host data is less than a remainder threshold. If not, then the memory controller may program the host data to a storage unit of the memory device at operation 906. If the size of the host data is less than the storage unit size, then the memory controller may retrieve log data at operation 908. Retrieving log data may include obtaining log data, for example, within the memory controller. For example, the memory controller may retrieve all or part of a logical block map, a management table, etc., as described herein. Optionally, the memory controller may generate a program data unit comprising the host data and the retrieved log data. For example, the program data unit may exist in a RAM of the memory device, at a register or set of registers for data to be stored at a memory array, etc.

At operation 910, the memory controller may program a storage unit at the memory device to include the host data and the retrieved log data. At least one of the storage sub-units of the storage unit may be a remainder storage sub-unit. At least one of the remainder sub-units may be programmed with the retrieved log data. At operation 912, the memory controller may store an indication that one or more storage sub-units including log data is logically invalid. The indication may be stored, for example, to a logical block map or other management table of the memory device.

Figure 10:
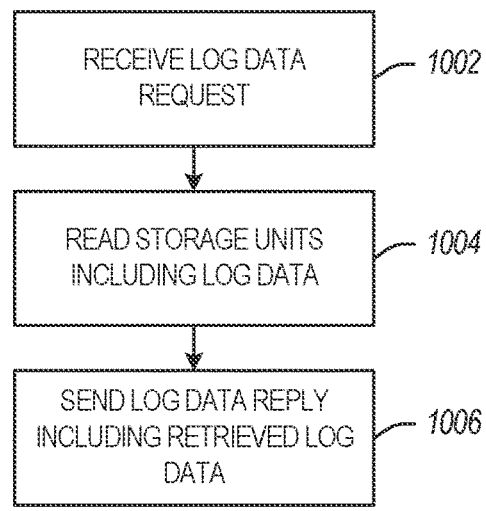
FIG. 10 is a flowchart showing one example of a process flow that may be executed, for example, by a memory controller to retrieve stored log data.
Figure 11:
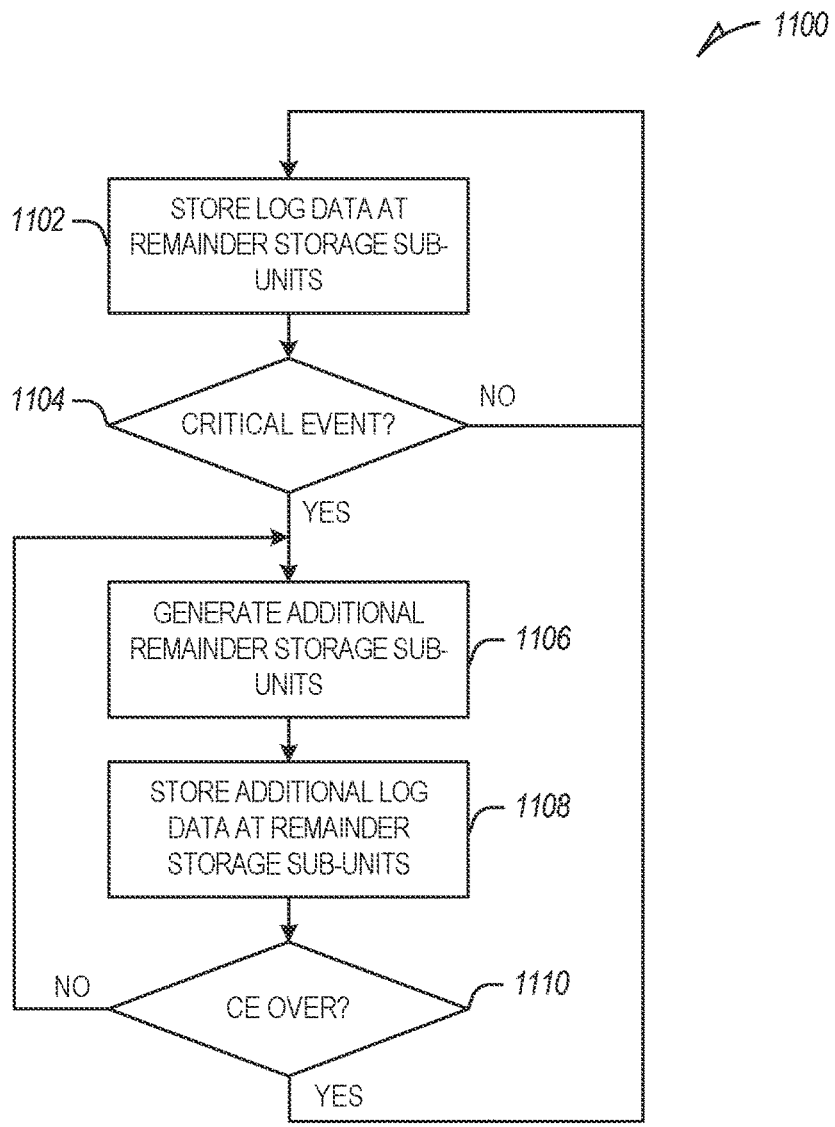
FIG. 11 is a flowchart showing one example of a process flow showing one example of a process flow that may be executed by a memory controller, for example, to store log data in view of critical events at a memory device.

FIG. 10 is a flowchart showing one example of a process flow 1000 that may be executed, for example, by a memory controller (such as memory controller 115 or memory controller 515) to retrieve stored log data. At operation 1002, the memory controller may receive a log data request. The log data request may be received from a host device, such as the host device 505. In some examples, the log data request may be received from another device that is used, for example, to diagnose problems at the host device. At operation 1004, the memory controller 515 may read storage units and/or storage sub-units that include log data. For example, the memory controller may keep a management table indicating storage units and/or storage sub-units that include log data (e.g., log data that has not yet been discarded at a garbage collection cycle). At operation 1006, the memory controller may send a log data reply message including the retrieved log data, FIG. 11 is a flowchart showing one example of a process flow 1100 showing one example of a process flow 1100 that may be executed by a memory controller (such as memory controller 115 or 515) to store log data in view of critical events at a memory device. At operation 1102, the memory controller may store log data at remainder storage sub-units, for example, as described herein with respect to the process flow 900. At operation 1104, the memory controller may determine if a critical event has occurred. A critical event may include any event or indication of an event characterizing a failure of the memory device. For example, a critical event may occur when the memory controller determines that a power interruption has occurred or is about to occur. Other example critical events may include, an internal inconsistency between correlated data structures, the detection of invalid values for state variables, data or metadata corruption, block or other hardware failure, etc.

If no critical event has occurred, the memory controller may continue to store log data at operation 1102. If a critical event is detected at operation 1104, the memory controller may generate additional remainder storage sub-units at operation 1106. Additional remainder storage sub-units may be generated in any suitable manner. For example, the memory controller may space the programming of host data over multiple busy cycles so as to leave additional remainder storage sub-units for storing log data. At operation 1108, the memory controller may store additional log data at the remainder storage sub-units. For example, the memory controller may store more log data than is stored at operation 1102. The additional log data may include, more historical transactions at the memory device, additional variables or quantities describing the memory device, the logical block map for the memory array, etc. In this way, if the critical event does lead to a failure of the memory device, the additional log data may provide additional description of the failure. At operation 1110, the memory controller may determine if the critical event detected at operation 1104 persists. If yes, the memory controller may return to operation 1106. If no, the memory controller may return to operation 1102.

Figure 12:
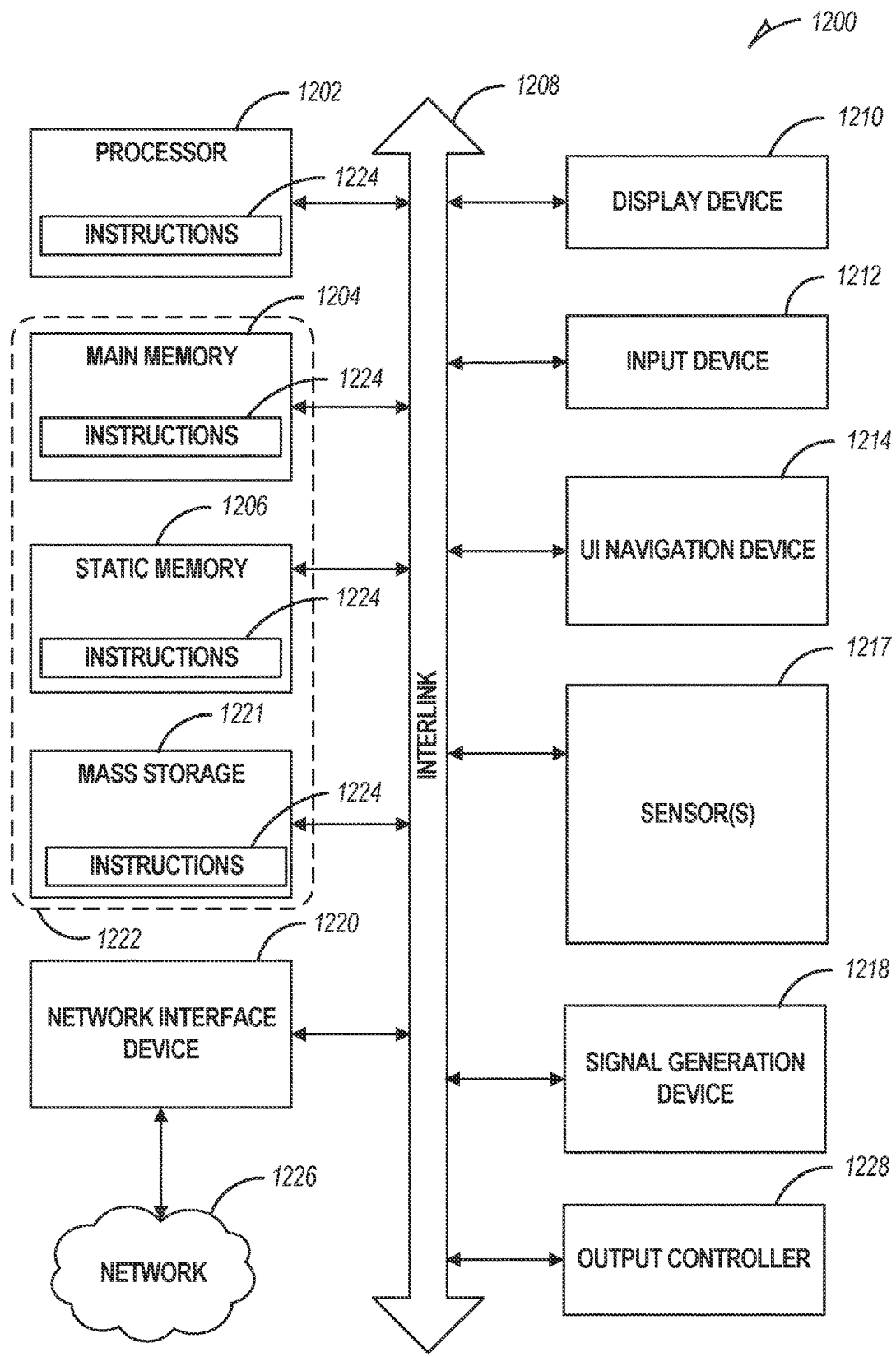
FIG. 12 is a block diagram illustrating an example of a machine upon which one or more embodiments may be implemented.

FIG. 12 illustrates a block diagram of an example machine 1200 upon which any one or more of the techniques (e.g., methodologies) discussed herein may perform. In alternative embodiments, the machine 1200 may operate as a standalone device or may be connected (e.g., networked) to other machines. In a networked deployment, the machine 1200 may operate in the capacity of a server machine, a client machine, or both in server-client network environments. In an example, the machine 1200 may act as a peer machine in peer-to-peer (P2P) (or other distributed) network environment. The machine 1200 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1200 (e.g., the host device 105, the memory device 110, etc.) may include a hardware processor 1202 (e.g., a central processing unit (CPU), a graphics processing unit (GPU), a hardware processor core, or any combination thereof, such as the memory controller 115, etc.), a main memory 1204 and a static memory 1206, some or all of which may communicate with each other via an interlink (e.g., bus) 1208. The machine 1200 may further include a display unit 1210, an alphanumeric input device 1212 (e.g., a keyboard), and a user interface (UI) navigation device 1214 (e.g., a mouse). In an example, the display unit 1210, input device 1212 and UI navigation device 1214 may be a touch screen display. The machine 1200 may additionally include a storage device (e.g., drive unit) 1216, a signal generation device 1218 (e.g., a speaker), a network interface device 1220, and one or more sensors 1217, such as a global positioning system (GPS) sensor, compass, accelerometer, or other sensor. The machine 1200 may include an output controller 1228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1216 may include a machine readable medium 1222 on which is stored one or more sets of data structures or instructions 1224 (e.g., software) embodying or utilized by any one or more of the techniques or functions described herein. The instructions 1224 may also reside, completely or at least partially, within the main memory 1204, within static memory 1206, or within the hardware processor 1202 during execution thereof by the machine 1200. In an example, one or any combination of the hardware processor 1202, the main memory 1204, the static memory 1206, or the storage device 1216 may constitute the machine readable medium 1222.

While the machine readable medium 1222 is illustrated as a single medium, the term "machine readable medium" may include a single medium or multiple media (e.g., a centralized or distributed database, or associated caches and servers) configured to store the one or more instructions 1224.

The term "machine readable medium" may include any medium that is capable of storing, encoding, or carrying instructions for execution by the machine 1200 and that cause the 1200 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1224 (e.g., software, programs, an operating system (OS), etc.) or other data are stored on the storage device 1221, can be accessed by the memory 1204 for use by the processor 1202. The memory 1204 (e.g., DRAM) is typically fast, but volatile, and thus a different type of storage than the storage device 1221 (e.g., an SSD), which is suitable for long-term storage, including while in an "off" condition. The instructions 1224 or data in use by a user or the machine 1200 are typically loaded in the memory 1204 for use by the processor 1202. When the memory 1204 is full, virtual space from the storage device 1221 can be allocated to supplement the memory 1204; however, because the storage 1221 device is typically slower than the memory 1204, and write speeds are typically at least twice as slow as read speeds, use of virtual memory can greatly reduce user experience due to storage device latency (in contrast to the memory 1204, e.g., DRAM). Further, use of the storage device 1221 for virtual memory can greatly reduce the usable lifespan of the storage device 1221.

In contrast to virtual memory, virtual memory compression (e.g., the Linus® kernel feature "ZRAM") uses part of the memory as compressed block storage to avoid paging to the storage device 1221. Paging takes place in the compressed block until it is necessary to write such data to the storage device 1221. Virtual memory compression increases the usable size of memory 1204, while reducing wear on the storage device 1221.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1224 may further be transmitted or received over a communications network 1226 using a transmission medium via the network interface device 1220 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1220 may include one or more physical jacks (e.g., Ethernet, coaxial, or phone jacks) one or more antennas to connect to the communications network 1226. In an example, the network interface device 1220 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1200, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Example 1 is a method for managing flash memory, the method comprising: receiving a first program request comprising first host data to be written to the flash memory, the flash memory comprising a number of storage units, wherein a first storage unit of the number of storage units comprises a number of storage sub-units; if the first host data is smaller than a remainder threshold: generating a first program data unit, wherein the first program data unit comprises the first host data and first log data describing the flash memory; programming the program data unit to the first storage unit of the flash memory, wherein the first log data is written to a first storage sub-unit of the number of storage sub-units; and storing an indication that the first storage sub-unit is invalid.

In Example 2, the subject matter of Example 1 optionally includes detecting a critical event related to the flash memory; generating a second program data unit comprising second log data describing the flash memory; programming the second program data unit at least in part to a second storage sub-unit, wherein the second storage sub-unit is of a second storage unit of the number of storage units; and storing an indication that the second storage sub-unit is invalid.

In Example 3, the subject matter of Example 2 optionally includes wherein detecting the critical event comprises detecting a power interruption to the flash memory.

In Example 4, the subject matter of any one or more of Examples 2-3 optionally includes wherein the second log data comprises at least a portion of a logical block map describing the flash memory.

In Example 5, the subject matter of any one or more of Examples 1-4 optionally includes wherein the first storage unit is a page of the flash memory and the first storage sub-unit is a sector of the page.

In Example 6, the subject matter of any one or more of Examples 1-5 optionally includes wherein the flash memory comprises a number of parallel-programmable pages, wherein the first storage unit is the number of parallel-programmable pages, and wherein the first storage sub-unit is a first page of the number of parallel-programmable pages.

In Example 7, the subject matter of Example 6 optionally includes wherein the flash memory comprises a number of parallel-programmable blocks, and wherein a first page of the number of parallel-programmable pages is part of a first block of the number of parallel-programmable blocks.

In Example 8, the subject matter of any one or more of Examples 1-7 optionally includes initiating a garbage collection cycle for the flash memory; and discarding the first log data from the first storage sub-unit.

In Example 9, the subject matter of any one or more of Examples 1-8 optionally includes receiving a log data request; reading at least the first storage sub-unit to obtain the first log data; and sending a log data reply comprising the first log data.

In Example 10, the subject matter of any one or more of Examples 1-9 optionally includes wherein the flash memory comprises a number of multilevel cells, and wherein the first storage sub-unit comprises a lower page of a multilevel cell.

Example 11 is a flash memory comprising: a flash memory, comprising a set of parallel-programmable pages; a memory controller configured to perform operations comprising: receiving a first program request comprising first host data to be written to the flash memory; if the first host data is smaller than a remainder threshold: generating a first program data unit, wherein the first program data unit comprises the first host data and first log data describing the flash memory; programming the first program data unit to a first set of pages of the flash memory in parallel, wherein each of the first set of pages belongs to a different block of a number of parallel-programmable blocks, and wherein the first log data is written to a first page of the first set of pages; and storing an indication that the first page is invalid.

In Example 12, the subject matter of Example 11 optionally includes wherein the memory controller is further configured to perform operations comprising: detecting a critical event related to the flash memory; generating a second program data unit comprising second log data describing the flash memory; programming the second program data unit at least in part to a second page of a second set of parallel-programmable pages, wherein each of the second set of parallel-programmable pages belongs to a different block of a number of parallel-programmable blocks of the flash memory; and storing an indication that the second page is invalid.

In Example 13, the subject matter of Example 12 optionally includes wherein detecting the critical event comprises detecting a power interruption to the flash memory.

In Example 14, the subject matter of any one or more of Examples 12-13 optionally includes wherein the second log data comprises at least a portion of a logical block map describing the flash memory.

In Example 15, the subject matter of any one or more of Examples 11-14 optionally includes wherein the memory controller is further configured to perform operations comprising: initiating a garbage collection cycle for the flash memory; and discarding the first log data from the first page.

In Example 16, the subject matter of any one or more of Examples 11-15 optionally includes wherein the memory controller is further configured to perform operations comprising: receiving a log data request; reading at least the first page to obtain the first log data; and sending a log data reply comprising the first log data.

Example 17 is a flash memory comprising: a flash memory comprising a number of pages, wherein a first page of the number of pages comprises a number of sectors; and a memory controller configured to perform operations comprising: receiving a first program request comprising first host data to be written to the flash memory; and if the first host data is less than a remainder threshold: generating a first program data unit, wherein the first program data unit comprises the first host data and first log data describing the flash memory; programming the first program data unit to the first page, wherein the first log data is written to a first sector of the first page; and storing an indication that the first sector of the first page is invalid.

In Example 18, the subject matter of Example 17 optionally includes wherein the memory controller is further configured to perform operations comprising: detecting a critical event related to the flash memory; generating a second program data unit comprising second log data describing the flash memory; programming the second program data unit at least in part to a second sector of a second page of the number of pages; and storing an indication that the second sector is invalid.

In Example 19, the subject matter of Example 18 optionally includes wherein detecting the critical event comprises detecting a power interruption to the flash memory.

In Example 20, the subject matter of any one or more of Examples 18-19 optionally includes wherein the second log data comprises at least a portion of a logical block map describing the flash memory.

In Example 21, the subject matter of any one or more of Examples 17-20 optionally includes wherein the memory controller is further configured to perform operations comprising: initiating a garbage collection cycle for the flash memory; and discarding the first log data from the first sector.

In Example 22, the subject matter of any one or more of Examples 17-21 optionally includes wherein the memory controller is further configured to perform operations comprising: receiving a log data request; reading at least the first sector to obtain the first log data; and sending a log data reply comprising the first log data.

Example 23 is a device readable storage medium, that provides instructions that, when executed by a controller of a memory device, optimizes voltage read level calibration in the memory device, wherein the instructions cause the controller to perform operations according to any of the techniques of Examples 1-22.

Example 24 is an apparatus comprising respective means for performing any of the methods or techniques of Examples 1-22.

Example 25 is a system, apparatus, or device to perform the operations of any of Examples 1-22.

Example 26 is a tangible machine readable medium embodying instructions to perform or implement the operations of any of Examples 1-22.

Example 27 is a method to perform the operations of any of Examples 1-22.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method for managing flash memory, the method comprising:
   receiving a first program request comprising first host data to be written to the flash memory, the flash memory comprising a number of storage units, a first storage unit of the number of storage units comprising a first set of storage sub-units, and a second storage unit of the number of storage units comprising a second set of storage sub-units;
   determining that the first host data can be written to the first storage unit with at least a portion of the first set of storage sub-units of the first storage unit left over;
   in response to determining that the first host data can be written to the first storage unit with at least the portion of the first set of storage sub-units left over, generating a first program data unit, the first program data unit comprising the first host data and first log data describing the flash memory;
   programming the first program data unit to the first storage unit of the flash memory;
   receiving a second program request comprising second host data to be written to the flash memory;
   determining that the second host data cannot be written to the second storage unit with at least a portion of the second set of storage sub-units left over; and
   in response to determining that the second host data cannot be written to the second storage unit with at least the portion of the second set of storage sub-units left over, programming the second host data to the second storage unit of the flash memory.

2. The method of claim 1, further comprising:
   detecting a critical event related to the flash memory;
   generating a second program data unit comprising second log data describing the flash memory;
   programming the second program data unit at least in part to a second storage unit, of the number of storage units; and
   storing an indication that the second log data is to be discarded in a garbage collection cycle for the second storage unit.

3. The method of claim 2, wherein detecting the critical event comprises detecting a power interruption to the flash memory.

4. The method of claim 2, wherein the second log data comprises at least a portion of a logical block map describing the flash memory.

5. The method of claim 1, further comprising:
   initiating a garbage collection cycle for the flash memory; and
   discarding the first log data from the first storage unit.

6. The method of claim 1, further comprising:
   receiving a log data request;
   reading at least one storage sub-unit of the first set of storage sub-units to obtain the first log data; and
   sending a log data reply comprising the first log data.

7. The method of claim 1, further comprising storing an indication that the first log data of the first program data unit is to be discarded in a garbage collection cycle for the first storage unit, wherein the storing of the indication that the first log data of the first program data unit is to be discarded in a garbage collection cycle for the first storage unit comprises storing an indication that a first sub-unit of the first set of storage sub-units is invalid, the first sub-unit comprising at least a portion of the first log data.

8. The method of claim 1, the first storage unit comprising a set of parallel-programmable pages and the portion of the first set of storage sub-units comprising at least one of the set of parallel-programmable pages.

9. The method of claim 1, the first storage unit comprising a first page and the portion of the first set of storage sub-units comprising at least one sector of the first page.

10. A flash memory comprising:
a flash memory, comprising a number of storage units, a first storage unit of the number of storage units comprising a first set of storage sub-units, and a second storage unit of the number of storage units comprising a second set of storage sub-units; and
a memory controller configured to perform operations comprising:
receiving a first program request comprising first host data to be written to the flash memory;
determining that the first host data can be written to the first storage unit with at least a portion of the first set of storage sub-units left over;
in response to determining that the first host data can be written to the first storage unit with at least the portion of the first set of storage sub-units left over, generating a first program data unit, the first program data unit comprising the first host data and first log data describing the flash memory;
programming the first program data unit to the first storage unit of the flash memory;
receiving a second program request comprising second host data to be written to the flash memory;
determining that the second host data cannot be written to the second storage unit with at least a portion of the second set of storage sub-units left over; and
in response to determining that the second host data cannot be written to the second storage unit with at least the portion of the second set of storage sub-units left over, programming the second host data to the second storage unit of the flash memory.

11. The flash memory of claim 10, the operations further comprising:
detecting a critical event related to the flash memory;
generating a second program data unit comprising second log data describing the flash memory;
programming the second program data unit at least in part to a second storage unit, of the number of storage units; and
storing an indication that the second log data is to be discarded in a garbage collection cycle for the second storage unit.

12. The flash memory of claim 11, wherein detecting the critical event comprises detecting a power interruption to the flash memory.

13. The flash memory of claim 11, wherein the second log data comprises at least a portion of a logical block map describing the flash memory.

14. The flash memory of claim 10, the operations further comprising:
initiating a garbage collection cycle for the flash memory; and
discarding the first log data from the first storage unit.

15. The flash memory of claim 10, the operations further comprising:
receiving a log data request;
reading at least one storage sub-unit of the first set of storage sub-units to obtain the first log data; and
sending a log data reply comprising the first log data.

16. The flash memory of claim 10, further comprising storing an indication that the first log data of the first program data unit is to be discarded in a garbage collection cycle for the first storage unit, wherein the storing of the indication that the first log data of the first program data unit is to be discarded in a garbage collection cycle for the first storage unit comprises storing an indication that a first sub-unit of the first set of storage sub-units is invalid, the first sub-unit comprising at least a portion of the first log data.

17. The flash memory of claim 10, the first storage unit comprising a set of parallel-programmable pages and the portion of the first set of storage sub-units comprising at least one of the set of parallel-programmable pages.

18. The flash memory of claim 10, the first storage unit comprising a first page and the portion of the first set of storage sub-units comprising at least one sector of the first page.

19. A non-transitory computer-readable medium comprising instructions thereon that, when executed by at least one processor, cause the at least one processor to perform operations comprising:
receiving a first program request comprising first host data to be written to a flash memory, the flash memory comprising a number of storage units, a first storage unit of the number of storage units comprising a first set of storage sub-units, and a second storage unit of the number of storage units comprising a second set of storage sub-units;
determining that the first host data can be written to the first storage unit with at least a portion of the first set of storage sub-units left over;
in response to determining that the first host data can be written to the first storage unit with at least the portion of the first set of storage sub-units left over, generating a first program data unit, the first program data unit comprising the first host data and first log data describing the flash memory left over;
programming the first program data unit to the first storage unit of the flash memory;
receiving a second program request comprising second host data to be written to the flash memory;
determining that the second host data cannot be written to the second storage unit with at least a portion of the second set of storage sub-units left over; and
in response to determining that the second host data cannot be written to the second storage unit with at least the portion of the second set of storage sub-units left over, programming the second host data to the second storage unit of the flash memory.

20. The non-transitory computer-readable medium of claim 19, further comprising storing an indication that the first log data of the first program data unit is to be discarded in a garbage collection cycle for the first storage unit, wherein the storing of the indication that the first log data of the first program data unit is to be discarded in a garbage collection cycle for the first storage unit comprises storing an indication that a first sub-unit of the first set of storage sub-units is invalid, the first sub-unit comprising at least a portion of the first log data.

* * * * *